(12) United States Patent
Fujita et al.

(10) Patent No.: US 8,508,302 B2
(45) Date of Patent: Aug. 13, 2013

(54) ELECTRONIC CIRCUIT

(75) Inventors: Seiji Fujita, Yokohama (JP); Tsuneo Tokumitsu, Osaka (JP)

(73) Assignees: Sumitomo Electric Industries, Ltd., Osaka (JP); Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 0 days.

(21) Appl. No.: 13/242,208

(22) Filed: Sep. 23, 2011

(65) Prior Publication Data

US 2012/0075003 A1 Mar. 29, 2012

(30) Foreign Application Priority Data

Sep. 24, 2010 (JP) .................. 2010-214471

(51) Int. Cl.
*H03F 1/26* (2006.01)
(52) U.S. Cl.
USPC ............................... 330/310; 330/98
(58) Field of Classification Search
USPC ................... 330/310, 98, 133, 150, 297
See application file for complete search history.

(56) References Cited

U.S. PATENT DOCUMENTS 6,020,848 A * 2/2000 Wallace et al. ............... 342/362
2008/0048764 A1 2/2008 Tokomitsu et al.

FOREIGN PATENT DOCUMENTS

JP 2008-35083 A 2/2008

* cited by examiner

*Primary Examiner* — Hieu Nguyen
(74) *Attorney, Agent, or Firm* — Westerman, Hattori, Daniels & Adrian, LLP

(57) ABSTRACT

An electronic circuit includes: first through third transistors having a control terminal, first and second terminals; a first direct current path supplying a direct current having passed through between the first terminal and the second terminal of at least one of the second transistor and the third transistor to the second terminal of the transistor at former position compared to the transistor through which the direct current passed; a second direct current path that is different from the first direct current path and supplies a direct current having passed through between the first terminal and the second terminal of at least one of the second transistor and the third transistor to the second terminal of the transistor at former position compared to the transistor through which the direct current passed; and a common coupling point coupling the first direct current path and the second direct current path in common.

10 Claims, 6 Drawing Sheets

FIG. 1A --PRIOR ART--
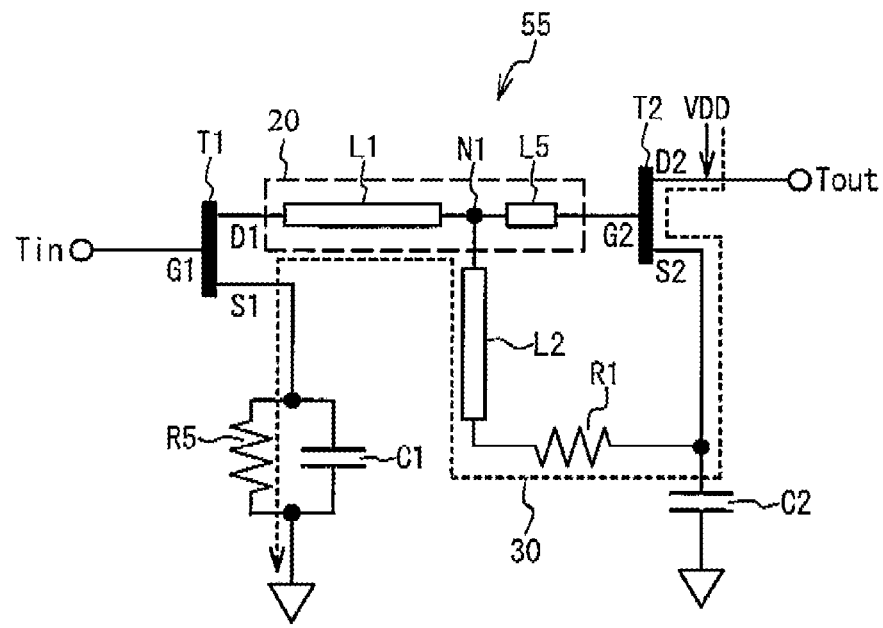
FIG. 1B --PRIOR ART--
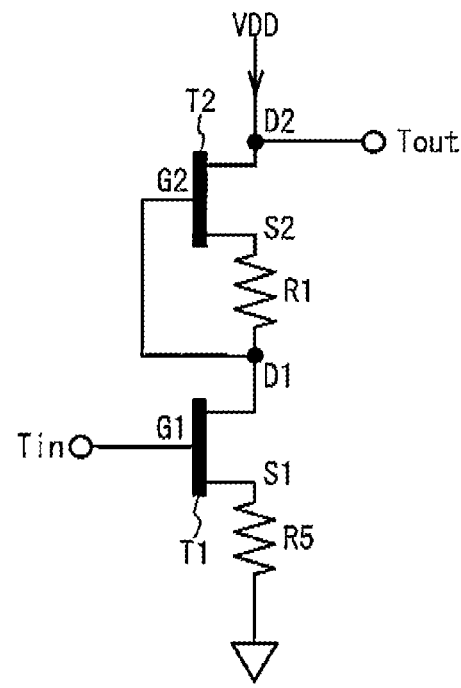

US 8,508,302 B2

ELECTRONIC CIRCUIT

CROSS-REFERENCE TO RELATED APPLICATION

This application is based upon and claims the benefit of priority of the prior Japanese Patent Application No. 2010-214471, filed on Sep. 24, 2010, the entire contents of which are incorporated herein by reference.

BACKGROUND (i) Technical Field

The present invention relates to an electronic circuit, and in particular, relates to a current reuse electronic circuit.

(ii) Related Art

There is known a current reuse electronic circuit using a latter DC (direct current) as a former DC in a multiple-stage electronic circuit. Japanese Patent Application Publication No. 2008-35083 (hereinafter referred to as Document 1) discloses an art where a current reuse electronic circuit is used as a doubler.

SUMMARY

The current reuse electronic circuit disclosed in Document 1 has a two-stage transistor structure. For example, when the current reuse electronic circuit is structured with three or more stage of transistors in order to improve the performance of the electronic circuit, it is necessary to reduce a voltage of each stage or increase a voltage of an electrical power supply. However, when the voltage of each stage is reduced, the performance of the electronic circuit may be degraded. It is necessary to prepare an electronic power supply having a high voltage in order to increase the voltage of the electrical power supply.

It is an object of the present invention to provide an electronic circuit using low electrical power voltage and having high performance.

According to an aspect of the present invention, there is provided an electronic circuit including: a first transistor having a control terminal to which a signal is input, a first terminal, and a second terminal; a second transistor having a control terminal coupled to the second terminal of the first transistor, a first terminal, and a second terminal; a third transistor having a control terminal coupled to the second terminal of the second transistor, a first terminal and a second terminal; a first direct current path supplying a direct current having passed through between the first terminal and the second terminal of at least one of the second transistor and the third transistor to the second terminal of the transistor at former position compared to the transistor through which the direct current passed; a second direct current path that is different from the first direct current path and supplies a direct current having passed through between the first terminal and the second terminal of at least one of the second transistor and the third transistor to the second terminal of the transistor at former position compared to the transistor through which the direct current passed; and a common coupling point coupling the first direct current path and the second direct current path in common.

BRIEF DESCRIPTION OF THE DRAWINGS

FIG. 1A illustrates a circuit diagram of an electronic circuit in accordance with a first comparative embodiment;

FIG. 1B illustrates a circuit diagram of the electronic circuit in galvanically configuration;

DETAILED DESCRIPTION

Figure 2A:
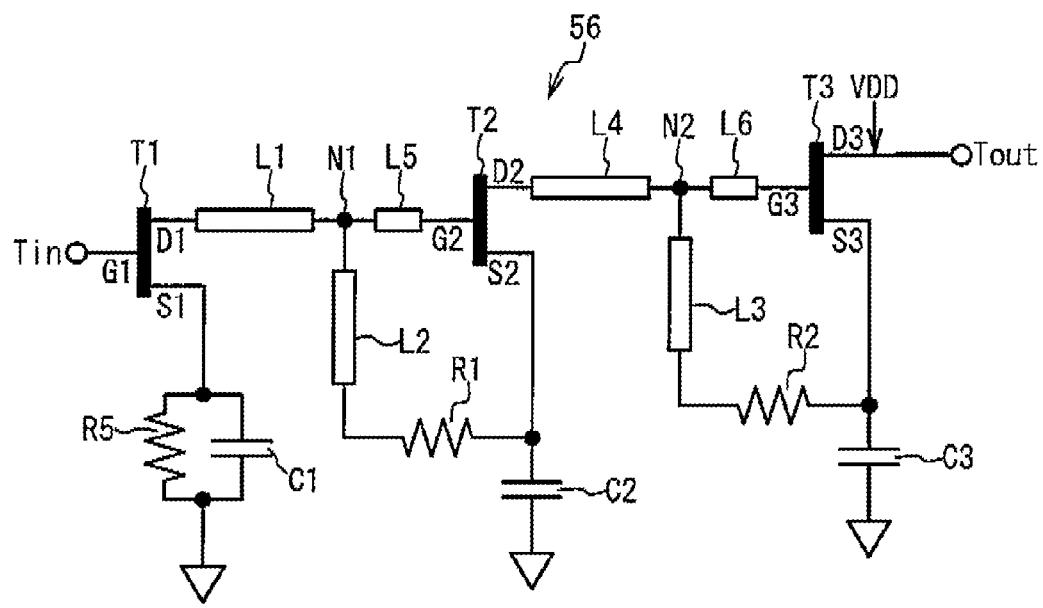
FIG. 2A illustrates a circuit diagram of an electronic circuit in accordance with a second comparative embodiment.

A description will be given of a current reuse amplifier circuit with reference to a first comparative embodiment. FIG. 1A illustrates a circuit diagram of an electronic circuit in accordance with the first comparative embodiment. FIG. 1B illustrates a circuit diagram of the electronic circuit in galvanically. As illustrated in FIG. 1A, an electronic circuit 55 is a two-stage amplifier circuit having a first transistor T1 and a second transistor T2. A description will be given of an example of an FET (Field Effect Transistor) acting as the first transistor T1 and the second transistor T2.

An inputting terminal Tin of the electronic circuit 55 is coupled to a gate G1 (control terminal) of the first transistor T1. A source S1 (first terminal) of the first transistor T1 is grounded via a capacitor C1 and a resistor R5. The capacitor C1 and the resistor R5 are coupled in parallel. The capacitor C1 grounds the source S1 in high frequency. The resistor R5 grounds the source S1 in galvanically and increases an electrical potential of the source S1. Thus, the source S1 is grounded in galvanically and in high frequency. A drain D1 (second terminal) of the first transistor T1 is coupled to a gate G2 (control terminal) of the gate G2 of the second transistor T2 via a distributed parameter transmission lines L1 and L5.

A source S2 (first terminal) of the second transistor T2 is grounded via a capacitor C2. The capacitor C2 grounds the source S2 in high frequency but does not ground the source S2 in galvanically. A distributed parameter line L2 and a first resistor R1 are coupled in series between a node N1 between the distributed parameter transmission lines L1 and L5 and the source S2. The distributed parameter lines L1, L2 and L5 make impedance matching between the first transistor T1 and the second transistor T2. The first resistor R1 makes electrical potential difference between the source S2 and the gate G2 and determines the potential applied to the gate G2. Further, the first resistor R1 makes resistance matching when making impedance matching between the first transistor T1 and the second transistor T2. The first resistor R1 may be coupled between the node N1 and the distributed parameter line L2. The drain D2 (second terminal) of the second transistor T2 is coupled to the outputting terminal Tout. The direct voltage VDD is applied to the drain D2 of the second transistor T2 via a choke inductance such as a stab.

A signal from an inputting terminal Tin is input to the gate G1 of the transistor T1, is amplified by the first transistor T1, and is output from the drain D1. The signal amplified by the first transistor T1 is input to the gate G2 of the second transistor T2, is amplified by the second transistor T2 and is output to the outputting terminal Tout from the drain D2.

The source S2 of the second transistor T2 is not grounded in galvanically because of the capacitor C2. Therefore, as illustrated in FIG. 1B, the direct current from an electrical power supply applying the direct voltage VDD passes through a direct current path 30 (illustrated in FIG. 1A) structured with the drain D2 of the second transistor T2, the source S2, the first resistor R1, the node N1, the drain D1 of the first transistor T1, the source S1 and the resistor R5. Thus, the direct voltage VDD is applied to the first transistor T1 and the second transistor T2 in series. The current from the electrical power supply applying the direct voltage VDD passes through the first transistor T1 and the second transistor T2.

In FIG. 1A, a high frequency signal (a signal having a frequency at which the electronic circuit 55 acts as an amplifier) is transmitted through a high frequency path 20 from the drain D1 of the first transistor T1 to the gate G2 of the second transistor T2. The direct current passes through the direct current path 30 from the source S2 of the second transistor T2 to the drain D1 of the first transistor T1. Thus, the direct current path 30, of which at least a part is different from the high frequency path 20, applies the direct voltage to the source S2 and the drain D2 of the second transistor T2.

It is therefore possible to reduce consumption current compared to an amplifier circuit supplying a current to each stage transistor independently. An identical voltage is applied to the first transistor T1 and the second transistor T2 when a gate width of the first transistor T1 is the same as that of the second transistor T2 and the resistance of the resistor R1 is the same as that of the resistor R5. It is therefore possible to increase a gain of the current reuse amplifier circuit and to downsize the current reuse amplifier circuit.

The number of the stage of transistor may be increased as a method for improving the performance of the current reuse circuit in accordance with the first comparative embodiment. For example, the number of the stage of the transistor may be increased to three from two when increasing the gain of the amplifier circuit. A second comparative embodiment is a current reuse circuit having a three-stage transistor structure.

Figure 2B:
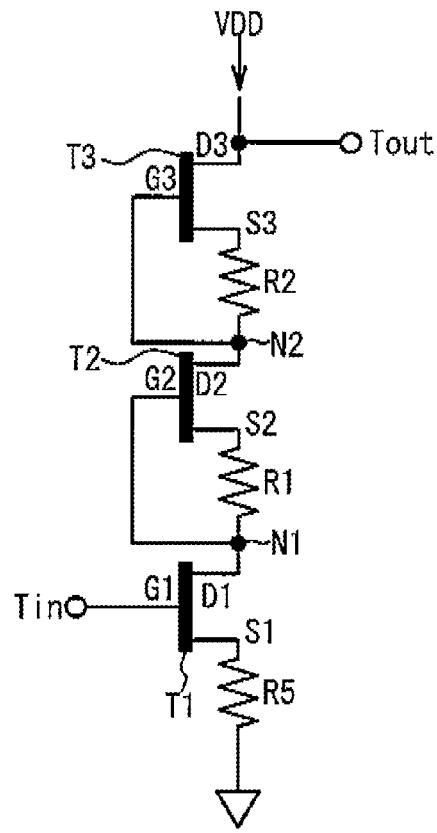
FIG. 2B illustrates a circuit diagram of the electronic circuit in galvanically.

FIG. 2A illustrates a circuit diagram of an electronic circuit in accordance with the second comparative embodiment. FIG. 2B illustrates a circuit diagram of the electronic circuit in galvanically. As illustrated in FIG. 2A, in an electronic circuit 56, the drain D2 of the second transistor T2 is coupled to the gate G3 (control terminal) of the third transistor T3 via the distributed parameter transmission lines L4 and L6.

The source S3 (first terminal) of the third transistor T3 is grounded via the capacitor C3. The capacitor C3 grounds the source S2 in high frequency, but does not ground the source S2 in galvanically. The distributed parameter line L3 and the second resistor R2 are coupled in series between the node N2 between the distributed parameter lines L4 and L6 and the source S3. The distributed parameter lines L3, L4 and L6 make impedance matching between the second transistor T2 and the third transistor T3. The second resistor R2 makes potential difference between the source S3 and the gate G3, and determines potential applied to the gate G3. The drain D3 of the third transistor T3 is coupled to the outputting terminal Tout. The direct voltage VDD is applied to the drain D3 of the third transistor T3 via a choke inductor such as a stab. The other structure is the same as FIG. 1A. Therefore, explanation of the other structure is omitted.

As illustrated in FIG. 2B, the direct current from the electrical power supply applying the direct voltage VDD passes through the drain D3 of the third transistor T3, the source S3, the second resistor R2, the node N2, the drain D2 of the second transistor T2, the source S2, the first resistor R1, the node N1 the drain D1 of the first transistor T1, the source S1 and the resistor R5. Thus, the direct voltage VDD is applied to the third transistor T3 from the first transistor T1 in series. The current from the electrical power supply applying the direct voltage VDD passes through from the first transistor T1 to the third transistor T3.

In accordance with the second comparative embodiment, the voltage of each transistor may be reduced when the direct voltage VDD that is the same as the first comparative embodiment is applied. Therefore, the performance of the electronic circuit 56 is not improved. For example, the gain or linearity performance is not increased. On the other hand, the direct voltage VDD becomes 1.5 times as the first comparative embodiment, when the voltage of each transistor is the same as the first comparative embodiment in order to improve the performance. In this case, it is prepare a high electrical power supply. And so, a description will be given of embodiments of an electronic circuit using low electrical power voltage and having high performance.

First Embodiment

Figure 3A:
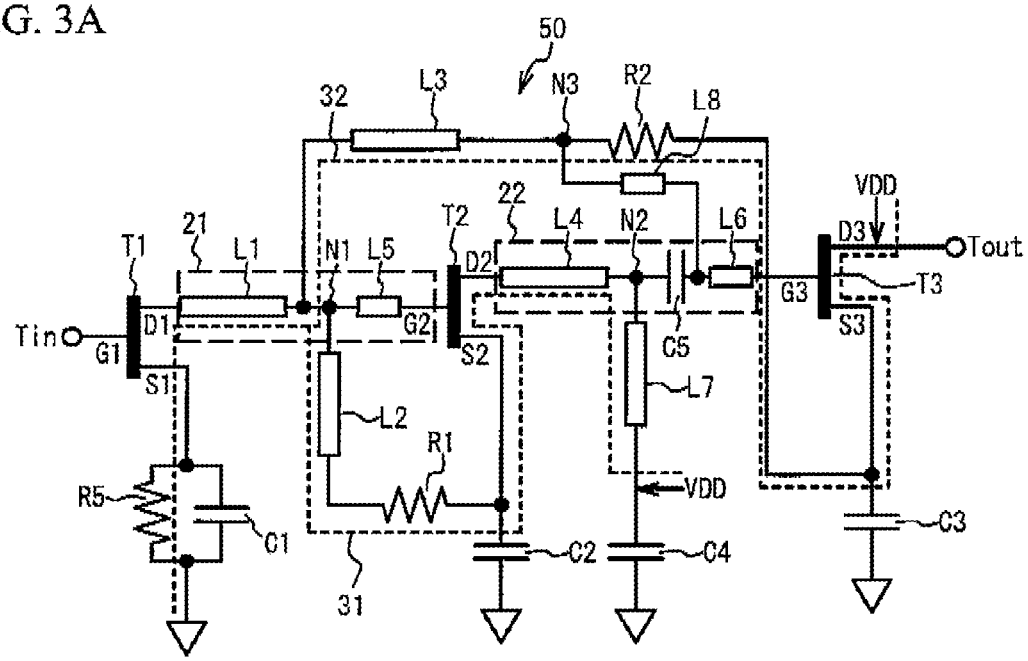
FIG. 3A illustrates a circuit diagram in accordance with a first embodiment.
Figure 3B:
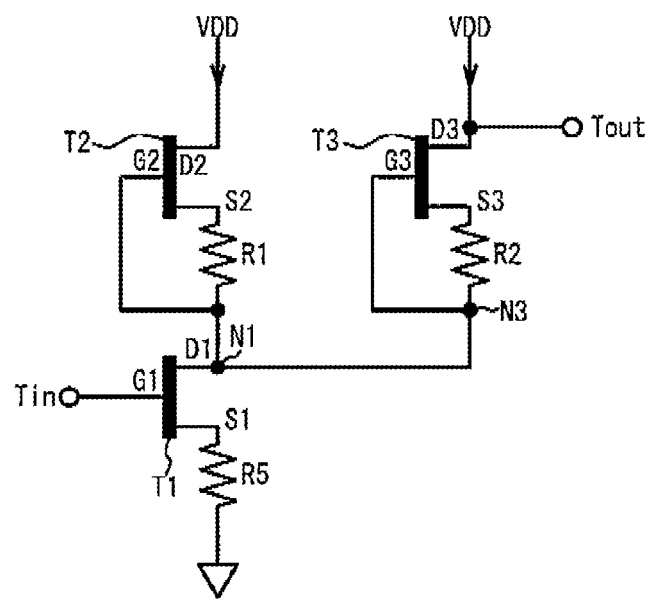
FIG. 3B illustrates a circuit diagram of the electronic circuit in galvanically.

FIG. 3A illustrates a circuit diagram of an electronic circuit in accordance with a first embodiment. FIG. 3B illustrates a circuit diagram of an electronic circuit in galvanically. In an electronic circuit 50, a distributed parameter line L4, a capacitor C5 and a distributed parameter line L6 are coupled to in series between the drain D2 of the second transistor T2 and the gate G3 of the transistor T3. The node N2 between the distributed parameter line L4 and the capacitor C5 is grounded via the distributed parameter line L7 and the capacitor C4. The direct voltage VDD is applied to a node between the distributed parameter line L7 and the capacitor C4 for cutting direct current via a choke inductor such as a stab. The distributed parameter line L3 and the second resistor R2 are coupled in series between the node N1 and the source S3. A distributed parameter line L8 is coupled between the third node N3 between the distributed parameter line L3 and the second resistor R2 and a node between the capacitor C5 and the distributed parameter line L6. The distributed parameter lines L4, L6, L7 and L8 and the capacitor C5 make impedance matching between the second transistor T2 and the third transistor T3. The capacitor C5 transmits a high frequency signal and cuts a direct current.

The source S3 of the third transistor T3 is grounded via the capacitor C3. The capacitor C3 grounds the source S3 in high frequency, but does not ground the source S3 in galvanically. The distributed parameter lines L6 and L8 and the second resistor R2 are coupled in series between the gate G3 of the third transistor T3 and the source S3 of the third transistor T3. The distributed parameter lines L3 and L8 are coupled in parallel at the node N3. The second resistor R2 makes potential difference between the source S3 and the gate G3, and determines potential applied to the gate G3. Resistors having resistance that is the same as the second resistor R2 may be respectively coupled between the node N1 and the distributed parameter line L3 and between the distributed parameter lines L6 and L8. The direct voltage VDD is applied to the drain D3 of the third transistor T3 via a choke inductor such as a stab. The other structure is the same as FIG. 1A. Therefore, explanation of the other structure is omitted.

A signal input from the inputting terminal Tin is input to the gate G1 of the first transistor T1, is amplified by the first transistor T1. The signal amplified by the first transistor T1 is output from the drain D1. The signal amplified by the first transistor T1 is input to the gate G2 of the second transistor T2, is amplified by the second transistor T2. The signal amplified by the second transistor T2 is output from the drain D2. The signal amplified by the second transistor T2 is input to the gate G3 of the third transistor T3, is amplified by the third transistor T3. The signal amplified by the third transistor T3 is output to the outputting terminal Tout from the drain D3. Thus, the electronic circuit 50 acts as a three-stage amplifier circuit.

On the other hand, as illustrated in FIG. 3A and FIG. 3B, the direct current from the electrical power supply applying the direct voltage VDD passes through a first direct current path 31. The first direct current path 31 is structured with the drain D2 of the second transistor T2, the source S2, the first resistor R1, the node N1, the drain D1 of the first transistor T1, the source S1 and the resistor R5. Further, direct current from the electrical power supply applying the direct voltage VDD passes through a second direct current path 32. The second direct current path 32 is structured with the drain D3 of the third transistor T3, the source S3, the second resistor R2, the node N1, the drain D1 of the first transistor T1, the source S1 and the resistor R5. Thus, the direct voltage VDD is applied to the first transistor T1 and the second transistor T2 in series, and is applied to the first transistor T1 and the third transistor T3 in series. The node N1 is a common coupling point of the first direct current path 31 and the second direct current path 32. Thus, the first direct current path 31 and the second direct current path 32 are coupled in parallel, because the common coupling point is provided. It is therefore possible to reduce the voltage of the direct voltage VDD.

In accordance with the first embodiment, in FIG. 3A, the gate G2 of the second transistor T2 is coupled to the drain D1 of the first transistor T1 in high frequency. A high frequency signal is transmitted via a first high frequency path 21 from the drain D1 of the first transistor T1 to the gate G2 of the second transistor T2. A direct current passes through the first direct current path 31 from the source S2 of the second transistor T2 to the drain D1 of the first transistor T1. Thus, the first direct current path 31 of which at least a part is different from the first high frequency path 21 applies a direct voltage to the source S2 and the drain D2 of the second transistor T2. Further, the gate G3 of the third transistor T3 and the drain D2 of the second transistor T2 are coupled in high frequency. A high frequency signal passes through a second high frequency path 22 from the drain D2 of the second transistor T2 to the gate G3 of the third transistor T3. The direct current passes through the second direct current path 32 from the source S3 of the third transistor T3 to the drain D1 of the first transistor T1. The second direct current path 32 of which at least a part is different from the first high frequency path 21, the second high frequency path 22 and the first direct current path 31 applies a direct voltage to the source S3 and the drain D3 of the third transistor T3.

The first direct current path 31 supplies a direct current having passed through between the source and the drain of at least one of the second transistor T2 and the third transistor T3 to the drain of the transistor at former position compared to the transistor through which the direct current passed. The second direct current path 32 supplies a direct current having passed through between the source and the drain of at least one of the second transistor T2 and the third transistor T3 to the drain of the transistor at former position compared to the transistor thorough which the direct current passed. The second direct current path 32 is different from the first direct current path 31. Further, the common coupling point (the node N1) couples the first direct current path 31 and the second direct current path 32 in common.

As mentioned above, two-stage transistors are coupled between the electrical power supply and the ground in galvanically. Therefore, the amplification of three-stage transistor is possible with the direct voltage VDD that is the same as the first comparative embodiment. Even if low electrical power voltages used, high performance can be obtained.

In accordance with the first embodiment, the first direct current path 31 couples the node N1 in the first high frequency path 21 and the source S2 of the second transistor T2. The second direct current path 32 couples the node N1 and the source S3 of the third transistor T3. The drain D2 of the second transistor T2 is not coupled to the gate G3 of the third transistor T3 in galvanically. The source S2 of the second transistor T2 is not grounded in galvanically, but is grounded in high frequency. The direct voltage VDD is applied to the drain D2 of the second transistor T2. The source S3 of the third transistor T3 is not grounded in galvanically but is grounded in high frequency. The direct voltage VDD is applied to the drain D3 of the third transistor T3.

The common coupling point (the node N1) is coupled to the drain D1 of the first transistor T1. The first direct current path 31 includes a path coupling between the common coupling point (the node N1) and the source S2 of the second transistor T2. The second direct current path 32 includes a path coupling between the common coupling point (the node N1) and the source S3 of the third transistor T3.

Thus, the second transistor T2 and the third transistor T3 are coupled in parallel in galvanically. Three transistors are coupled in high frequency. Thus, a current having passed though the second transistor T2 and the third transistor T3 passes through the first transistor T1. Therefore, the gate width of the first transistor T1 is larger than that of the second transistor T2 and the third transistor T3. It is therefore possible to reduce noise factor (NF) because the gate width of the first transistor T1 at first stage is increased.

For example, in order to apply an identical voltage to each transistor, it is necessary that the gate width of the second transistor T2 is the same as that of the third transistor T3, and the gate width of the first transistor T1 is two times as the gate width of the second transistor T2 and the third transistor T3. In this case, the resistance of the resistor R1 is the same as that of the resistor R2. The resistance of the resistor R5 is half of the resistors R1 and R2.

Further, in accordance with the first embodiment, the first resistor R1 is coupled in the first direct current path 31 in series, and the second resistor R2 is coupled in the second direct current path 32. The first resistor R1 determines potential difference between the source S2 of the second transistor T2 and the gate G2 of the second transistor T2 so that a predetermined potential is determined at the gate G2 of the second transistor T2. The second resistor R2 makes potential difference between the source S3 of the third transistor T3 and the gate G3 of the third transistor T3, and determines potential applied on the gate G3 of the third transistor T3. Thus, potential of each transistor can be determined.

Further, in accordance with the first embodiment, one end of the distributed parameter line L1 is coupled to the drain D1 of the first transistor T1, and the other of the distributed parameter line L1 is coupled to the node N1. The distributed parameter line L2 is coupled to the first resistor R1 in series between the node N1 and the source S2 of the second transistor T2. The distributed parameter line L3 is coupled to the second resistor R2 in series between the node N1 and the source S3 of the third transistor T3. That is, the distributed parameter line L1 (first distributed parameter line) is provided in series with the first resistor R1 in the first direct current path 31. The distributed parameter line L2 (second distributed parameter line) is provided in series with the second resistor R2 in the second direct current path 32.

One end of the distributed parameter line L4 is coupled to the drain D2 of the second transistor T2. The other of the distributed parameter line L4 is coupled to the node N2. One end of the distributed parameter line L6 is coupled to the gate G3 of the third transistor T3. The other of the distributed parameter line L6 is coupled to the node N2 via the capacitor C5. One end of the distributed parameter line L7 is coupled to the node N2. The other of the distributed parameter line L7 is coupled to the direct voltage VDD. The distributed parameter line L8 is coupled in parallel with the second resistor R2 between a node between the capacitor C5 and the distributed parameter line L6 and the source S3 of the third transistor T3.

The distributed parameter line L1 and the distributed parameter line L5 make impedance matching between the drain D1 of the first transistor T1 and the gate G2 of the second transistor T2. The distributed parameter line L2 and the distributed parameter line L3 act as an open stab between the first transistor T1 and the second transistor T2 and make impedance matching between the first transistor T1 and the second transistor T2.

The distributed parameter line L4, the distributed parameter line L6 and the capacitor C5 make impedance matching between the drain D2 of the second transistor T2 and the gate G3 of the third transistor T3. The distributed parameter line L7 and the distributed parameter line L8 act as an open stab between the second transistor T2 and the third transistor T3, and make impedance matching between the second transistor T2 and the third transistor T3.

Therefore, the impedance can be matched between the first transistor T1 and the second transistor T2 and between the second transistor T2 and the third transistor T3.

The capacitor C5 is provided between the drain D2 of the second transistor T2 and the gate G3 of the third transistor T3. One end of a bias path is coupled to the second direct current path 32. The other end of the bias path is coupled to between the capacitor C5 and the gate G3 of the third transistor T3. The capacitor C5 in galvanically isolates the drain D2 of the second transistor T2 from the gate G3 of the third transistor T3. The second direct current path 32 applies a direct voltage to the gate G3 of the third transistor T3 via the bias path.

Figure 4:
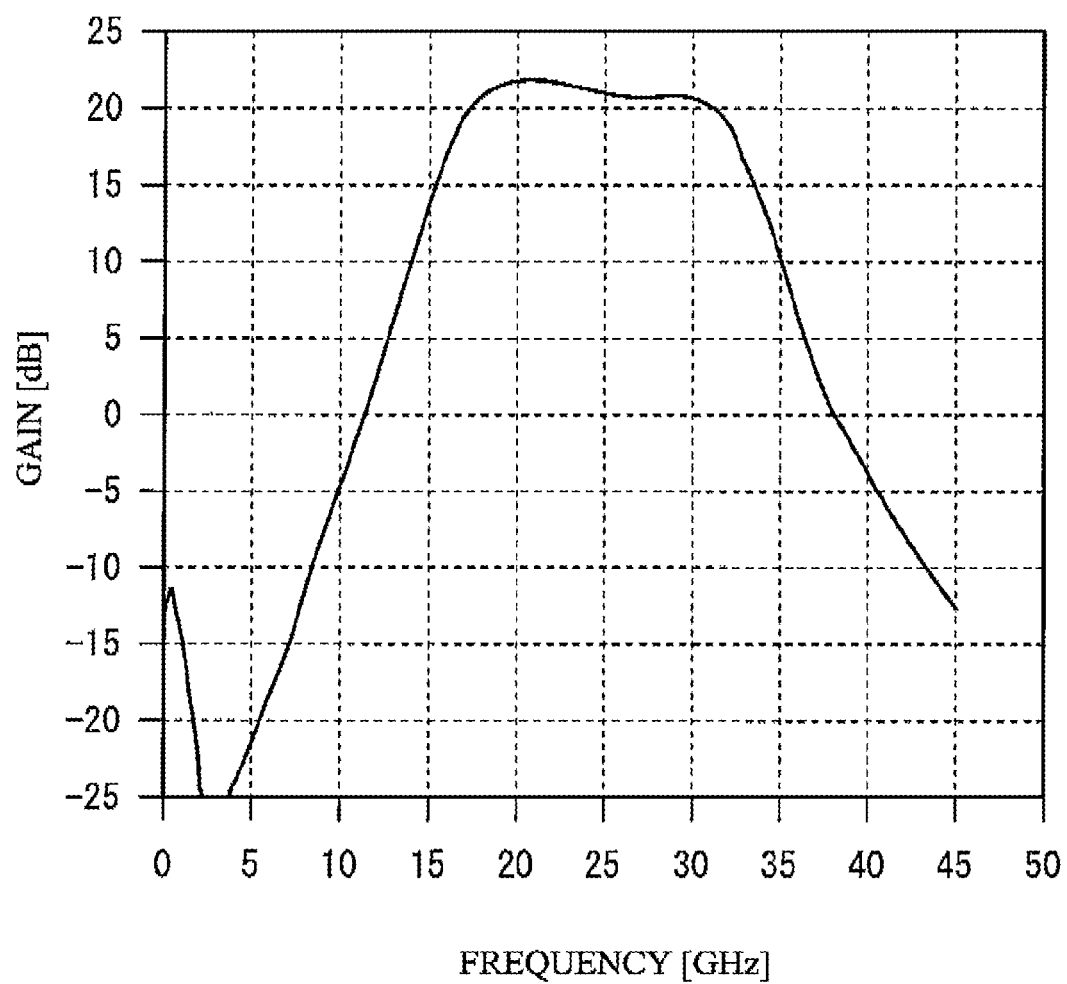
FIG. 4 illustrates a simulation result of a gain with respect to frequency of the electronic circuit.

FIG. 4 illustrates a result of a simulation of a gain with respect to a frequency of the electronic circuit in accordance with the first embodiment. The transistors T1 through T3 are a HEMT (High Electron Mobility Transistor) having gate length of 0.1 µm, an electron supply layer made of AlGaAs, and an electron transit layer made of GaAs. Table 1 shows a gate width W of each transistor, a resistance of each resistor, capacitance of each capacitor, and size (length L and width W) of each distributed parameter line. A substrate of a distributed parameter circuit was made of GaAs and had thickness of 250 µm. The direct voltage VDD was 5V.

TABLE 1

|  | T1 | T2 | T3 |
|---|---|---|---|
| W µm | 640 | 320 | 320 |
|  | R1 | R2 | R5 |
| Ω | 4.8 | 4.8 | 2.4 |
|  | C1 | C2 | C3 | C4 | C5 |
| pF | 7 | 3 | 11.8 | 12 | 0.6 |

TABLE 1-continued

|  | L1 | L2 | L3 | L4 | L5 | L6 | L7 |
|---|---|---|---|---|---|---|---|
| L µm | 320 | 600 | 1800 | 460 | 50 | 50 | 750 |
| W µm | 20 | 20 | 20 | 20 | 20 | 20 | 20 |

As illustrated in FIG. 4, in the first embodiment, the gain (S21) in a frequency range from 17 GHz to 31 GHz exceeds 20 dB. For example, when the frequency is 24 GHz, the gain is 21.5 dB. When the frequency is 30 GHz, the gain is 20.6 dB. The gain was 15 dB at a maximum, when a simulation was performed with use of the structure of the first comparative embodiment. Thus, in accordance with the first embodiment, the gain is increased compared to the first comparative embodiment.

Second Embodiment

Figure 5A:
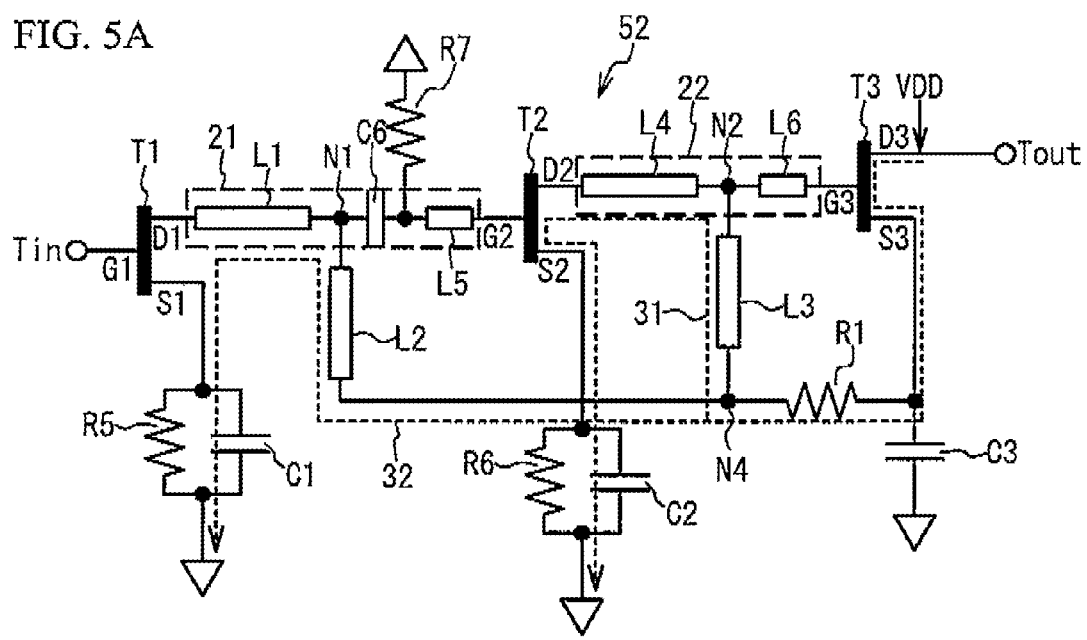
FIG. 5A illustrates a circuit diagram of an electronic circuit in accordance with a second embodiment.
Figure 5B:
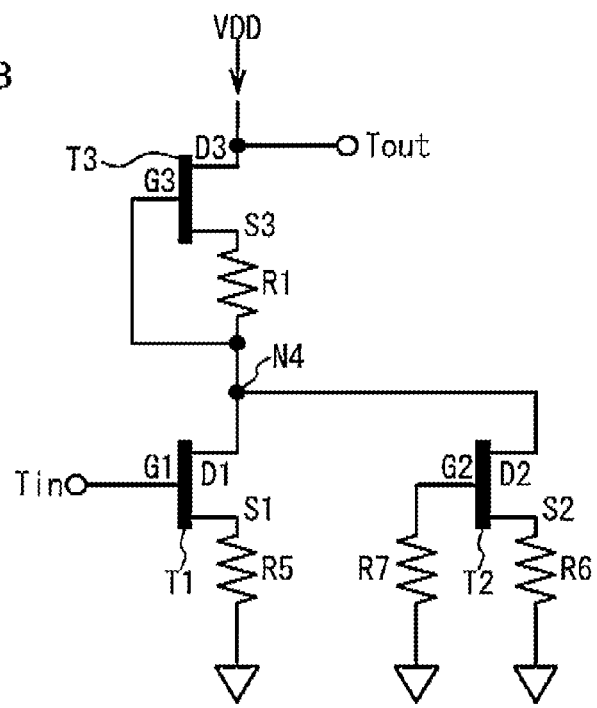
FIG. 5B illustrates a circuit diagram of the electronic circuit in galvanically.

FIG. 5A illustrates a circuit diagram of an electronic circuit in accordance with a second embodiment. FIG. 5B illustrates a circuit diagram of the electronic circuit in galvanically. In an electronic circuit 52, the distributed parameter line L1, the capacitor C6 and the distributed parameter line L5 are coupled in series between the drain D1 of the first transistor T1 and the gate G2 of the second transistor T2. A node between the capacitor C6 and the distributed parameter line L5 is grounded via the resistor R7. The distributed parameter line L3 is coupled between the node N4 between the distributed parameter line L2 and the first resistor R1 and the node N2 between the distributed parameter line L4 and the distributed parameter line L6. In FIG. 5B, the resistor R7 is grounded in galvanically. The distributed parameter lines L1, L2 and L5 and the capacitor C6 make impedance matching between the first transistor T1 and the second transistor T2. The capacitor C6 transmits a high frequency signal and cuts a direct current. The source S2 of the second transistor T2 is grounded via the resistor R6 and the capacitor C2. The source S2 is grounded in galvanically and in high frequency.

The distributed parameter line L4 and the distributed parameter line L6 are coupled in series between the drain D2 of the second transistor T2 and the gate G3 of the third transistor T3. The distributed parameter lines L3, L4 and L6 make impedance matching between the second transistor T2 and the third transistor T3. The source S3 of the third transistor T3 is grounded via the capacitor C3. The capacitor C3 grounds the source S3 in high frequency but does not ground the source S3.

The distributed parameter line L2 and the first resistor R1 are coupled in series between the node N1 between the distributed parameter line L1 and the capacitor C6 and the source S3 of the third transistor T3. The distributed parameter line L3 and the first resistor R1 are coupled in series between the node N2 between the distributed parameter line L4 and the distributed parameter line L6 and the source S3 of the third transistor T3. The distributed parameter line L2 and the distributed parameter line L3 are coupled in parallel at the node N4. A resistor having the same resistance as the first resistor R1 may be coupled between the node N1 and the distributed parameter line L2 and between the node N2 and the distributed parameter line L3. The direct voltage VDD is applied to the drain D3 of the third transistor T3 via a choke inductor such as a stab. The other structure is the same as FIG. 1A. Therefore, explanation of the other structure is omitted.

A signal input from the inputting terminal Tin is input to the gate G1 of the first transistor T1, is amplified by the first transistor T1, and is output from the drain D1. The signal amplified by the first transistor T1 is input to the gate G2 of the second transistor T2, is amplified by the second transistor T2, and is output from the drain D2. The signal amplified by the second transistor T2 is input to the gate G3 of the third transistor T3, is amplified by the third transistor T3, and is output to the outputting terminal Tout from the drain D3. Thus, the electronic circuit 52 acts as a three-stage amplifier circuit.

On the other hand, as illustrated in FIG. 5B, the direct current from the electrical power supply applying the direct voltage VDD passes the second direct current path 32 illustrated in FIG. 5A structured with the drain D3 of the third transistor T3, the source S3, the first resistor R1, the drain D1 of the first transistor T1, the source S1 and the resistor R5. Further, the direct current from the electrical power supply applying the direct voltage VDD passes through the first direct current path 31 illustrated in FIG. 5A structured with the drain D3 of the third transistor T3, the source S3, the first resistor R1, the drain D2 of the second transistor T2, the source S2, and the resistor R6. Thus, the direct voltage VDD is applied to the first transistor T1 and the third transistor T3 in series, and is applied to the second transistor T2 and the third transistor T3 in series. The node N4 is a common coupling point between the first direct current path 31 and the second direct current path 32. The first direct current path 31 and the second direct current path 32 are coupled in parallel because the common coupling point is provided. It is therefore possible to reduce the direct voltage VDD.

In accordance with the second embodiment, in FIG. 5A, the first high frequency path 21 couples the gate G2 of the second transistor T2 and the drain D1 of the first transistor T1 in high frequency. A high frequency signal is transmitted from the drain D1 of the first transistor T1 to the gate G2 of the second transistor T2 via the first high frequency path 21. A direct current passes through the first direct current path 31 from the source S3 of the third transistor T3 to the drain D2 of the second transistor T2. Thus, a direct voltage is applied to the source S2 and the drain D2 of the second transistor T2 by the first direct current path 31 of which at least a part is different from the first high frequency path 21. Further, the second high frequency path 22 couples the gate G3 of the third transistor T3 and the drain D2 of the second transistor T2 in high frequency. A high frequency signal is transmitted from the drain D2 of the second transistor T2 to the gate G3 of the third transistor T3 via the second high frequency path 22. A direct current passes through the second direct current path 32 from the source S3 of the third transistor T3 to the drain D1 of the first transistor T1.

Thus, a direct voltage is applied to the source S3 and the drain D3 of the third transistor T3 by the second direct current path 32 of which at least a part is different from the first high frequency path 21, the second high frequency path 22 and the first direct current path 31.

The first direct current path 31 supplies a direct current having passed through between the source and the drain of the third transistor T3 to the drain of the second transistor T2. The second direct current path 32 supplies a direct current having passed through between the source and the drain of the third transistor T3 to the drain of the first transistor T1. Further, the common coupling point (the node N4) couples the first direct current path 31 and the second direct current path 32 in common.

As mentioned above, two-stage transistors are coupled between the electrical power supply and the ground in galvanically. Therefore, the amplification of three-stage transistor is possible with the direct voltage VDD that is the same as the first comparative embodiment. Even if low electrical power voltage is used, high performance can be obtained.

In accordance with the second embodiment, the second direct current path 32 couples the node N1 in the first high frequency path 21 and the source S3 of the third transistor T3. The first direct current path 31 couples the node N2 in the second high frequency path 22 and the source S3 of the third transistor T3. The drain D1 of the first transistor T1 is not coupled to the gate G2 of the second transistor T2 in galvanically. The source S3 of the third transistor T3 T2 is not grounded in galvanically, but is grounded in high frequency. The source S3 of the third transistor T3 is not grounded in galvanically but is grounded in high frequency. The direct voltage VDD is applied to the drain D3 of the third transistor T3.

The common coupling point (the node N4) is coupled to the source S3 of the first transistor T3. The first direct current path 31 includes a path coupling between the common coupling point (the node N4) and the drain D2 of the second transistor T2. The second direct current path 32 includes a path coupling between the common coupling point (the node N4) and the drain D1 of the first transistor T2.

Thus, the first transistor T1 and the second transistor T2 are coupled in parallel in galvanically. Three transistors are coupled in high frequency. Thus, a current having passed though the first transistor T1 and the second transistor T2 passes through the third transistor T3. Therefore, the gate width of the third transistor T3 is larger than that of the first transistor T1 and the second transistor T2. Accordingly, high output and low distortion are possible because the gate width of the third transistor T3 of last stage gets higher.

For example, in order to apply an identical voltage to each transistor, it is necessary that the width of the first transistor T1 is the same as that of the second transistor, and the gate width of the third transistor is two times as that of the first transistor T1 and the second transistor T2. In this case, the resistance of the resistor R5 can be the same as that of the resistor R6. The resistance of the first resistor R1 can be half of the resistors R5 and R6.

Further, the first resistor R1 is coupled between the common coupling point (the node N4) and the source S3 of the third transistor T3. Thus, electrical potential of each transistor can be determined.

Further, one end of the distributed parameter line L1 is coupled to the drain D1 of the first transistor T1. The other of the distributed parameter line L1 is coupled to the node N1. The distributed parameter line L2 is coupled to the resistor R1 (second resistor) between the node N1 and the source S3 of the third transistor T3 in series. The distributed parameter line L2 (a second distributed parameter line) is coupled between the node N4 and the drain D1 of the first transistor T1. One end of the distributed parameter line L5 is coupled to the gate G2 of the second transistor T2. The other of the distributed parameter line L5 is coupled to the node N1 via the capacitor C6. The distributed parameter line L3 is coupled to the first resistor R1 in series between the node N2 and the source S3 of the third transistor T3. The distributed parameter line L3 (first distributed parameter line) is coupled between the node N4 and the drain D2 of the second transistor T2. One end of the distributed parameter line L4 is coupled to the drain D2 of the second transistor T2. The other of the distributed parameter line L4 is coupled to the node N2. One end of the distributed parameter line L6 is coupled to the gate G3 of the third transistor T3. The other of the distributed parameter line L6 is coupled to the node N2.

The distributed parameter line L1, the capacitor C6 and the distributed parameter line L5 make impedance matching between the drain D1 of the first transistor T1 and the gate G2 of the second transistor T2. The distributed parameter line L2 acts as an open stab between the first transistor T1 and the second transistor T2 and thereby makes impedance matching between the first transistor T1 and the second transistor T2.

The distributed parameter line L4 and the distributed parameter line L6 make impedance matching between the drain D2 of the second transistor T2 and the gate G3 of the third transistor T3. The distributed parameter line L3 acts as an open stab between the second transistor T2 and the third transistor T3, and thereby make impedance matching between the second transistor T2 and the third transistor T3. It is therefore possible to make impedance matching between the first transistor T1 and the second transistor T2 and between the second transistor T2 and the third transistor T3.

Further, the first direct current path 31 applies a direct bias to the gate G3 of the third transistor T3. It is therefore possible to apply a direct voltage to the gate G3 of the third transistor T3 via the first direct current path 31.

On the other hand, the capacitor C6 is coupled between the drain D1 of the first transistor T1 and the gate G2 of the second transistor T2. The second direct current path 32 has a path coupling the capacitor C6 and the drain D1 of the first transistor T1. A bias separated from the second direct current path 32 by the capacitor C6 in galvanically is applied between the capacitor C6 and the gate G2 of the second transistor T2. It is therefore possible to apply a direct voltage to the gate G2 of the second transistor T2.

Figure 6:
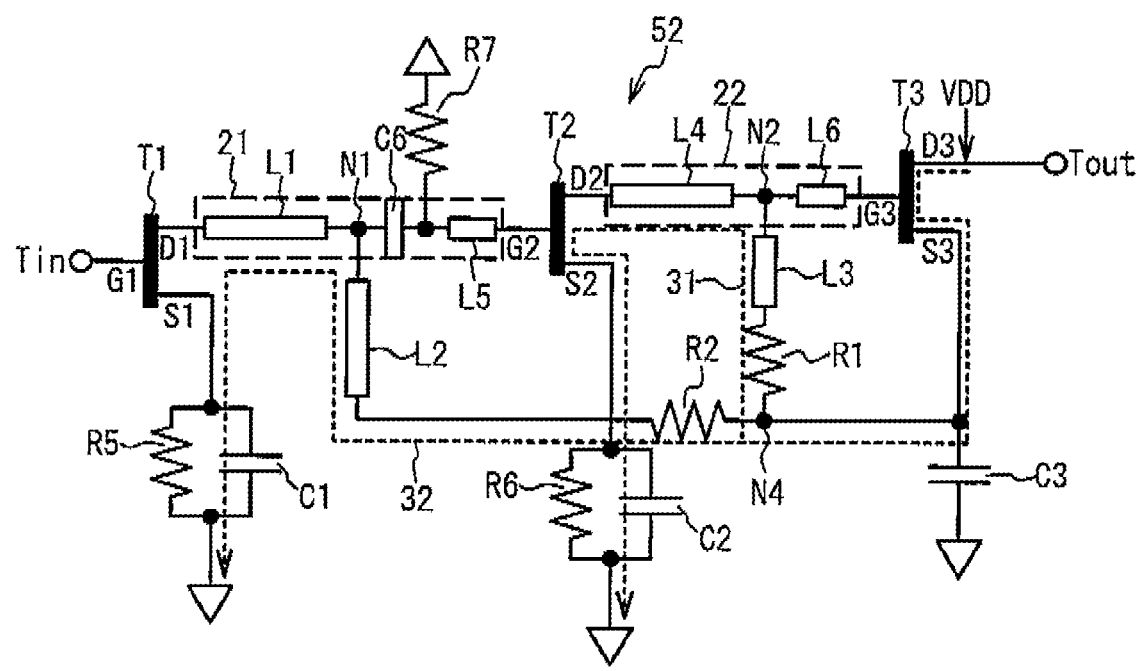
FIG. 6 illustrates a circuit diagram of an electronic circuit in accordance with a modified embodiment of the second embodiment.

FIG. 6 illustrates a circuit diagram of an electronic circuit in accordance with a modified embodiment of the second embodiment. As illustrated in FIG. 6, the first resistor R1 is coupled between the node N4 and the distributed parameter line L3. The second resistor R2 is coupled between the node N4 and the distributed parameter line L2. There are no resistors between the node N4 and the source S3. The other structure is the same as FIG. 5A of the second embodiment. Therefore, explanation of the other structure is omitted. In this way, the first resistor R1 may be coupled between the node N4 and the drain D2 of the second transistor T2. The second resistor R2 may be coupled between the node N4 and the drain D1 of the first transistor T1. It is therefore possible to determine electrical potential of each transistor. The first resistor R1 has only to be coupled between the node N2 and the node N4. The second resistor R2 has only to be coupled between the node N1 and the node N4.

In the above-mentioned embodiments, a description is given of an FET (Field Effect Transistor) as the first transistor T1 through the third transistor T3. However, the first transistor T1 through the third transistor T3 may be a bipolar transistor. In this case, an emitter corresponds to the first terminal, a collector corresponds to the second terminal, and a base corresponds to the control terminal. The distributed parameter line may be an inductance element such as an inductor. In the above-mentioned embodiments, a description is given of a three-stage transistor structure. However, the present invention may be applied to a four or more stage transistor structure. In the above-mentioned embodiments, an amplifier circuit is described as an electronic circuit. However, an electronic circuit other than the amplifier may be used.

"coupling from in high frequency" in the above-mentioned embodiments means a coupling of a signal having a frequency included in a frequency range at which an electronic circuit can operate. "coupling in galvanically" in the above-mentioned embodiments, means a coupling of a signal having a frequency that is sufficiently lower than the frequency range at which an electronic circuit can operate.

The present invention is not limited to the specifically disclosed embodiments and variations but may include other embodiments and variations without departing from the scope of the present invention.

What is claimed is:

1. An electronic circuit comprising:
   a first transistor having a control terminal to which a signal is input, a first terminal, and a second terminal;
   a second transistor having a control terminal coupled to the second terminal of the first transistor, a first terminal, and a second terminal;
   a third transistor having a control terminal coupled to the second terminal of the second transistor, a first terminal and a second terminal;
   a common coupling point coupled to the second terminal of the first transistor;
   a first direct current path coupled between the common coupling point and the first terminal of the third transistor; and
   a second direct current path that is different from the first direct current path and coupled between the common coupling point and the first terminal of the second transistor.

2. The electronic circuit as claimed in claim 1 further comprising:
   a first resistor coupled in the first direct current path in series; and
   a second resistor coupled in the second direct current path in series.

3. The electronic circuit as claimed in claim 2, wherein:
   a first distributed parameter line is provided in series with the first resistor in the first direct current path; and
   a second distributed parameter line is provided in series with the second resistor in the second direct current path.

4. The electronic circuit as claimed in claim 1 further comprising:
   a capacitor provided between the second terminal of the second transistor and the control terminal of the third transistor; and
   a bias path of which one end is coupled to the first direct current path and the other is coupled to between the capacitor and the control terminal of the third transistor.

5. An electronic circuit comprising:
   a first transistor having a control terminal to which a signal is input, a first terminal, and a second terminal;
   a second transistor having a control terminal coupled to the second terminal of the first transistor, a first terminal, and a second terminal;
   a third transistor having a control terminal coupled to the second terminal of the second transistor, a first terminal and a second terminal;
   a common coupling point coupled to the first terminal of the third transistor;
   a first direct current path coupled between the common coupling point and the second terminal of the second transistor; and
   a second direct current path that includes a path different from the first direct current path and coupled between the common coupling point and the second terminal of the first transistor.

6. The electronic circuit as claimed in claim 5 further comprising:
   a first resistor coupled to between the common coupling point and the second terminal of the second transistor; and
   a second resistor coupled to between the common coupling point and the second terminal of the first transistor.

7. The electronic circuit as claimed in claim 5 further comprising a first resistor coupled to between the common coupling point and the first terminal of the third transistor.

8. The electronic circuit as claimed in claim 6 further comprising:
- a first distributed parameter line coupled to between the common coupling point and the second terminal of the second transistor; and
- a second distributed parameter line coupled to between the common coupling point and the second terminal of the first transistor.

9. The electronic circuit as claimed in claim 6, wherein the first direct current path applies a bias to the control terminal of the third transistor.

10. The electronic circuit as claimed in claim 5 further comprising a capacitor coupled to between the second terminal of the first transistor and the control terminal of the second transistor,
wherein:
- the second direct current path includes a path coupling between the capacitor and the second terminal of the first transistor; and
- a bias separated from the second direct current path by the capacitor in galvanically is supplied to between the capacitor and the control terminal of the second transistor.

* * * * *